United States Patent [19]

Zlamal

[11] Patent Number: 5,699,233
[45] Date of Patent: Dec. 16, 1997

[54] CONTROL UNIT HOUSING WITH INTERCONNECTING CONDUCTOR PATHS

[75] Inventor: Vlastimil Zlamal, Regensburg, Germany

[73] Assignee: Siemens Aktiengesellschaft, Munich, Germany

[21] Appl. No.: 506,737

[22] Filed: Jul. 26, 1995

[30] Foreign Application Priority Data

Jul. 26, 1994 [DE] Germany .................. 44 26 465.8

[51] Int. Cl.$^6$ .................. H05K 5/02; H05K 1/14; H05K 1/11; H01R 9/09
[52] U.S. Cl. .................. 361/759; 361/796; 361/803; 361/736; 439/76.2
[58] Field of Search .................. 257/678, 723, 257/724, 787; 361/728, 796, 785, 803, 736, 752, 759, 801; 439/76.2, 76.1, 949

[56] References Cited

U.S. PATENT DOCUMENTS 5,229,916  7/1993  Frankeny et al. .................. 361/707

FOREIGN PATENT DOCUMENTS

| 2753236 | 5/1982 | Germany . | |
| 8715173 | 4/1988 | Germany . | |
| 4016532 | 11/1990 | Germany . | |
| 4035526 | 5/1992 | Germany . | |
| 3611224 | 12/1992 | Germany . | |
| 4142138 | 4/1993 | Germany . | |
| 3942392 | 9/1994 | Germany . | |
| 4-69995 | 3/1992 | Japan | 361/796 |
| 4-324995 | 11/1992 | Japan | 361/796 |
| 4-326797 | 11/1992 | Japan | 361/796 |
| 5-267502 | 10/1993 | Japan | 257/686 |
| 6-45518 | 2/1994 | Japan | 361/820 |
| 6-140777 | 5/1994 | Japan | 361/736 |

*Primary Examiner*—Donald Sparks
*Attorney, Agent, or Firm*—Herbert L. Lerner; Laurence A. Greenberg

[57] ABSTRACT

A control unit for a motor vehicle includes a housing having internal terminals. A main printed circuit board is disposed in the housing for carrying a circuit. Electrical connections are disposed between the internal terminals and the main printed circuit board. At least one plug part has external electrical terminals. An additional printed circuit board on which the at least one plug part is secured, is embedded in plastic, forms a part of the housing and has conductor tracks connecting the external terminals and the internal terminals to one another.

6 Claims, 3 Drawing Sheets

CONTROL UNIT HOUSING WITH INTERCONNECTING CONDUCTOR PATHS

BACKGROUND OF THE INVENTION

Field of the Invention

The invention relates to a control unit for a motor vehicle, in which electrical terminals in the interior of a housing, to which electronic component groups or units are connected, for example by the bonding technique, are connected to one another by electrical terminals that protrude from the housing, for instance in the form of plug pins, in order to connect the control unit to other control units or to line plugs.

Heretofore, in order to connect such terminals, stamped metal strips (German Published, Non-Prosecuted Application DE 36 11 224 A1 or German Utility Model DE 87 15 073 U) which are extrusion-coated with insulating plastic and fixed, have been used. Only the inner and outer terminals are then visible from the outside. However, such stamped metal strips are suitable only for connections in which both the inner and the outer terminals themselves are of relatively great length and in which, in the case of multiple terminals, such as in a multi-pin plug, the individual terminals are relatively far apart. However, if the terminals themselves are rather small, and if they are close together, then the stamped metal strips are no longer suitable as connections. The structures that are then required are too fine to be made by stamping. The danger also exists that the fine, closely spaced conductor structures will bend upon being extrusion-coated with plastic, making short circuits possible.

SUMMARY OF THE INVENTION

It is accordingly an object of the invention to provide a control unit for a motor vehicle, which overcomes the hereinafore-mentioned disadvantages of the heretofore-known devices of this general type and which has a connection structure between outer and inner electrical terminals that can still be used even for very small, closely spaced terminals.

With the foregoing and other objects in view there is provided, in accordance with the invention, a control unit for a motor vehicle, comprising a housing having internal terminals; a main printed circuit board disposed in the housing for carrying a circuit; electrical connections between the internal terminals and the main printed circuit board; at least one plug part having external electrical terminals; and an additional printed circuit board on which the at least one plug part is secured, the additional printed circuit board being embedded in plastic, forming a part of the housing and having conductor tracks connecting the external terminals and the internal terminals to one another.

In accordance with another feature of the invention, the at least one plug part is a multi-pin plug, and the external terminals are plug pins of the multi-pin plug.

In accordance with a further feature of the invention, the plug pins are soldered or press-fitted onto the additional printed circuit board.

In accordance with an added feature of the invention, the internal terminals are bond pads.

In accordance with a concomitant feature of the invention, the bond pads are widened ends of the conductor tracks and are coated with a bondable material which may be gold, aluminum or nickel.

The object of the invention is thus attained by producing the connection structure through the use of conductor tracks on a printed circuit board. Through the use of this "connection printed circuit board", the outer and inner terminals are joined together by a conductor structure that enables the use of very narrow, close-together conductor tracks, which moreover do not deform on being extrusion-coated with plastic but instead remain immovably where they were.

Other features which are considered as characteristic for the invention are set forth in the appended claims. Although the invention is illustrated and described herein as embodied in a control unit for a motor vehicle, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
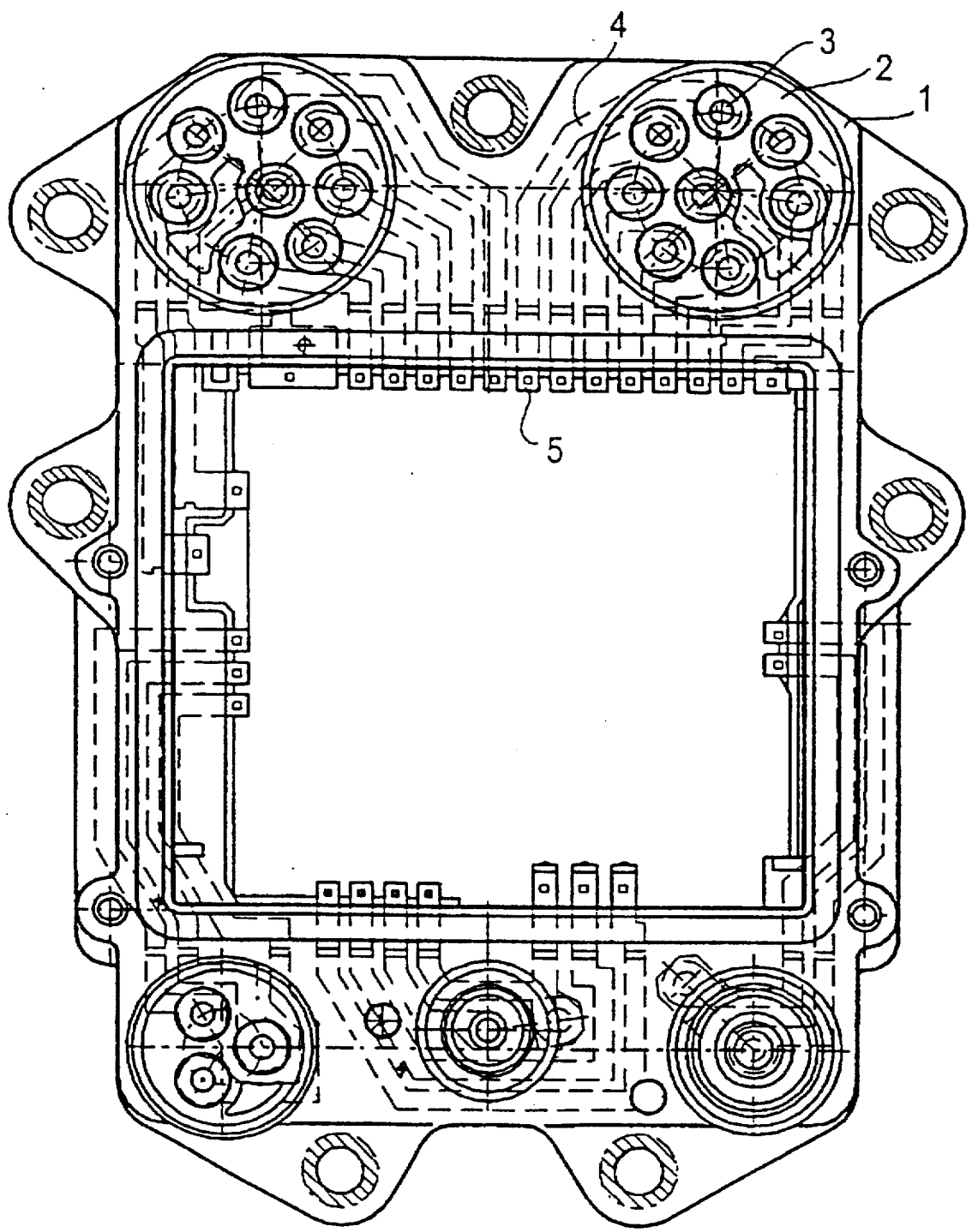
FIG. 1 is a diagrammatic, plan view of a control unit of the prior art.

Referring now to the figures of the drawing in detail and first, particularly, to FIG. 1 thereof, there is seen a housing 1 of a control unit according to the prior art. The housing 1 has various multi-pin plugs 2 on its exterior in the form of at least one plug part. These plugs or plug parts have individual plug pins 3 in the form of external electrical terminals, by way of which the housing can be connected to other housings or line plugs. Stamped conductor tracks 4 lead from the plug pins 3 or external electrical terminals to terminals 5 in the interior of the housing. In the exemplary embodiment of FIG. 1, the internal terminals 5 are bond pads, to which electronic component groups located inside the housing are then connected through the use of bonded wires. For purposes of retention and insulation, the stamped conductor tracks 4 are extrusion-coated with the same plastic in which the entire housing is potted. They are therefore also shown in dashed lines, because they are not visible from the outside.

Figure 2:
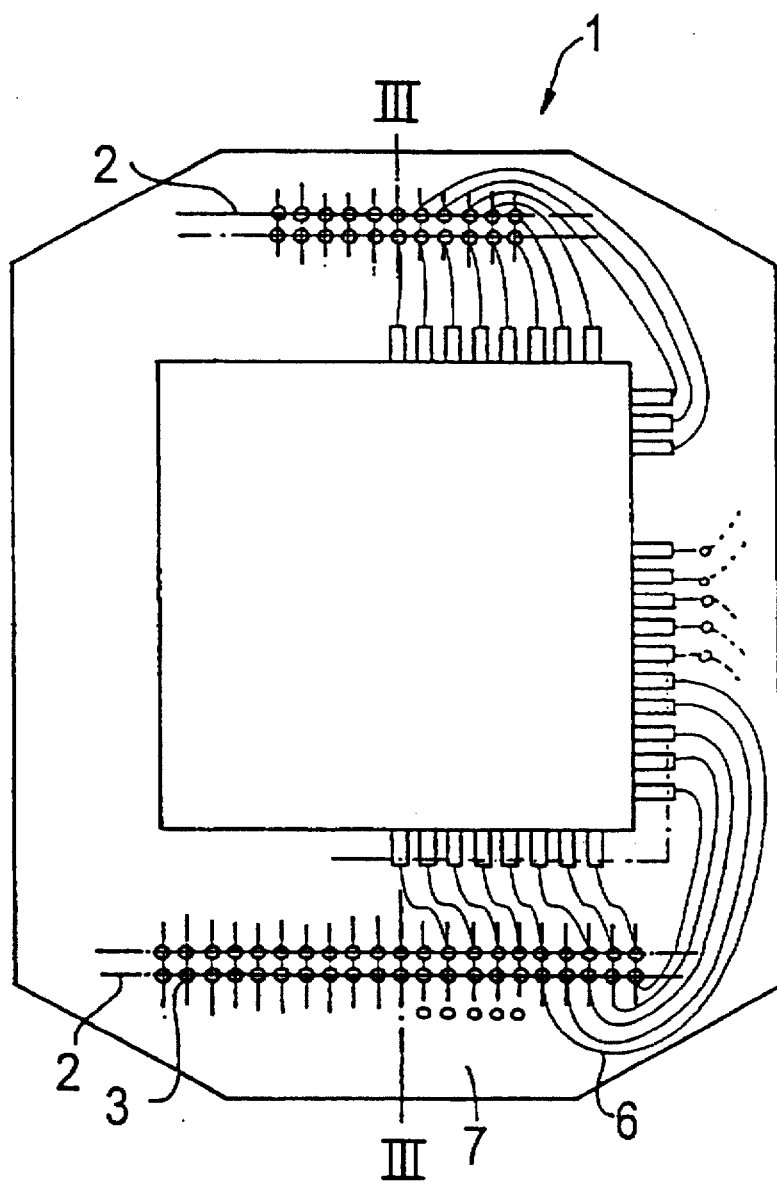
FIG. 2 is a front-elevational view of a control unit according to the invention.

FIG. 2 shows a control unit according to the invention, such as an ignition control unit or an engine control unit of a motor vehicle, with a connection structure that replaces the stamped conductor tracks used heretofore. Two multi-pin plugs or plug parts 2 with plug pins or external electrical terminals 3 are shown diagrammatically. Terminals in the interior of the housing 1 are identified by reference numeral 5. In this case, a connection between the plug pins 3 and the internal terminals 5 in the interior of the housing is made through the use of conductor tracks 6 that are mounted on a connection or additional printed circuit board 7.

Figure 3:
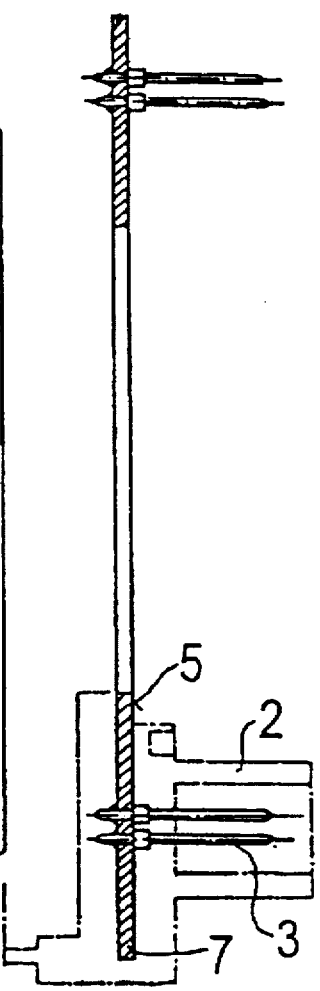
FIG. 3 is a sectional view of the control unit of the invention which is taken along a line III—III of FIG. 2.

FIG. 3 shows a cross section through the structure of FIG. 2, which is taken along a line III—III. The plug pins 3 of the multi-pin plugs 2 are electrically contacted, for instance by being soldered for press-fitted-in on the connection printed circuit board 7. The terminals 5 on the interior of the housing are constructed in this case as bond pads that include a wider end region of the corresponding conductor track, which connects the various plug pins with the associated terminal inside the housing, and which are optionally coated with a bondable material, such as gold, aluminum or nickel.

Figure 4:
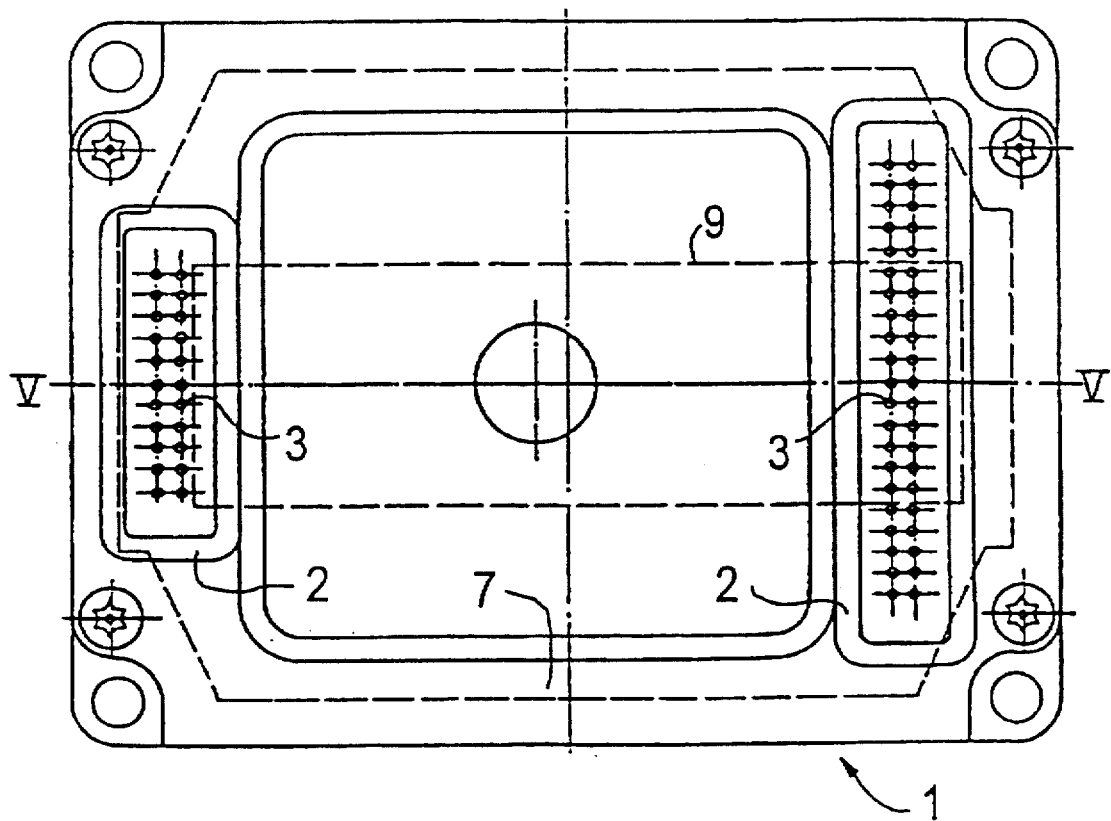
FIG. 4 is a plan view of a control unit of the invention.

FIG. 4 shows a plan view of a control unit having a housing 1 and two multi-pin plugs 2, which have individual plug pins 3. The circuit is not shown, for the sake of simplicity. The connection printed circuit board 7 is shown as a structure drawn in dashed lines, because it has been extrusion-coated with plastic, pressed-in into the plastic part or otherwise embedded in it and integrated firmly with the plug housing 1 and cannot be seen from the outside.

Figure 5:
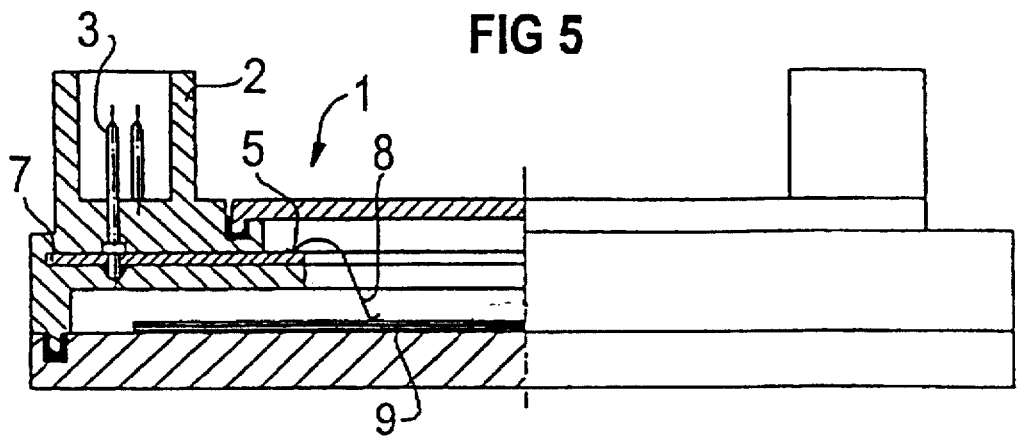
FIG. 5 is a sectional view of the control unit which is taken along a line V—V of FIG. 4.

FIG. 5 is a half-side cross section through the housing shown in FIG. 4, which is taken along a line V—V. Only a single multi-pin plug 2 with the individual plug pins 3 is shown. The plug pins 3 are electrically contacted on the connection printed circuit board 7, for example by being soldered or press-fitted, and are connected to the terminals 5 inside the housing through conductor tracks on the connection printed circuit board, although the conductor tracks are not visible in this case. Further bond wires 8 lead from the terminals 5 to a substrate or main printed circuit board 9, which carries electronic component groups of an electrical circuit located in the housing.

I claim:
1. A control unit for a motor vehicle, comprising:
   a housing having internal terminals;
   a main printed circuit board disposed in said housing for carrying a circuit;
   electrical connections between said internal terminals and said main printed circuit board;
   at least one plug part having external electrical terminals; and
   an additional printed circuit board on which said at least one plug part is secured, said additional printed circuit board being embedded in plastic, forming a part of said housing and having conductor tracks connecting said external terminals and said internal terminals to one another.

2. The control unit according to claim 1, wherein said at least one plug part is a multi-pin plug, and said external terminals are plug pins of said multi-pin plug.

3. The control unit according to claim 2, wherein said plug pins are soldered onto said additional printed circuit board.

4. The control unit according to claim 2, wherein said plug pins are press-fitted onto said additional printed circuit board.

5. The control unit according to claim 1, wherein said internal terminals are bond pads.

6. The control unit according to claim 5, wherein said bond pads are widened ends of said conductor tracks and are coated with a bondable material selected from the group consisting of gold, aluminum and nickel.

* * * * *